United States Patent
Goh et al.

(10) Patent No.: US 11,264,160 B2
(45) Date of Patent: Mar. 1, 2022

(54) EXTENDED PACKAGE AIR CORE INDUCTOR

(71) Applicant: Intel Corporation, Santa Clara, CA (US)

(72) Inventors: Eng Huat Goh, Penang (MY); Jiun Hann Sir, Gelugor (MY); Min Suet Lim, Simpang Ampat (MY); Chin Lee Kuan, Bayan Lepas (MY); Siew Fong Yap, Bayan Lepas (MY)

(73) Assignee: Intel Corporation, Santa Clara, CA (US)

( * ) Notice: Subject to any disclaimer, the term of this patent is extended or adjusted under 35 U.S.C. 154(b) by 286 days.

(21) Appl. No.: 16/402,467

(22) Filed: May 3, 2019

(65) Prior Publication Data
US 2020/0027639 A1   Jan. 23, 2020

(30) Foreign Application Priority Data

Jul. 23, 2018 (MY) .......................... PI 2018702566

(51) Int. Cl.
*H01F 27/02* (2006.01)
*G05F 1/56* (2006.01)

(52) U.S. Cl.
CPC ............. *H01F 27/027* (2013.01); *G05F 1/56* (2013.01)

(58) Field of Classification Search
None
See application file for complete search history.

(56) References Cited

U.S. PATENT DOCUMENTS

| | | | |
|---|---|---|---|
| 6,362,525 B1 * | 3/2002 | Rahim | H01L 23/49838 257/528 |
| 6,707,680 B2 * | 3/2004 | Schaper | H05K 1/023 174/524 |
| 9,607,917 B2 * | 3/2017 | Moussaoui | H01L 23/49555 |
| 9,767,957 B2 * | 9/2017 | Liu | H01F 41/043 |
| 10,083,922 B2 * | 9/2018 | Lim | H01L 23/3157 |
| 10,163,557 B2 * | 12/2018 | Lambert | H01F 17/0033 |
| 2011/0215863 A1 * | 9/2011 | Pan | H01L 23/642 327/564 |
| 2011/0266671 A1 * | 11/2011 | Youm | H01L 23/49827 257/738 |
| 2017/0025363 A1 * | 1/2017 | Tsai | H01L 21/4853 |
| 2017/0092412 A1 * | 3/2017 | Manusharow | H01L 21/486 |
| 2017/0098997 A1 * | 4/2017 | Hamada | H01F 17/0013 |
| 2018/0175002 A1 * | 6/2018 | Loo | H01L 25/0655 |

* cited by examiner

*Primary Examiner* — Thomas J. Hiltunen
(74) *Attorney, Agent, or Firm* — Schwegman Lundberg & Woessner, P.A.

(57) ABSTRACT

An electronic device comprises an air core inductor including an electronic semiconductor package including a first portion of the air core inductor internal to the electronic semiconductor package; and an electrically conductive layer arranged on a first external surface of the electronic semiconductor package and electrically connected as a second portion of the air core inductor.

19 Claims, 8 Drawing Sheets

EXTENDED PACKAGE AIR CORE INDUCTOR

PRIORITY APPLICATION

This application claims the benefit of priority to Malaysian Application Serial Number PI 2018702566, filed Jul. 23, 2018, which is incorporated herein by reference in its entirety.

TECHNICAL FIELD

Embodiments pertain to packaging of integrated circuits (ICs). Some embodiments relate to including inductors in IC packages.

BACKGROUND

Electronic systems often include integrated circuits (ICs) that are connected to a subassembly such as a substrate or motherboard. The ICs can be packaged and inserted into an IC package that is mounted on the subassembly. As electronic system designs become more complex, it is a challenge to meet the desired size constraints of the system. One aspect that can influence the overall size of a design is the spacing required for inductive circuit elements that traditionally are relatively large. As the size of the electronic circuit assemblies are reduced and electronic packages become more complex, the packaged electronic assemblies can become less robust and the cost of meeting the spacing requirements can increase. Thus, there are general needs for devices, systems and methods that address the spacing challenges for contacts of ICs yet provide a robust and cost effective design.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

A fully-integrated voltage regulator (FIVR) is a voltage regulator (e.g., voltage converter) included in the same integrated circuit (IC) device with other components (e.g., processing circuitry, memory circuitry, and other circuitry) of the IC device. A FIVR circuit can be used to produce a voltage domain for the IC device by increasing or decreasing the voltage of the power source. IC devices of the same design may have multiple voltage domains; and an IC device may include multiple FIVR circuits to establish multiple voltage domains.

Figure 1:
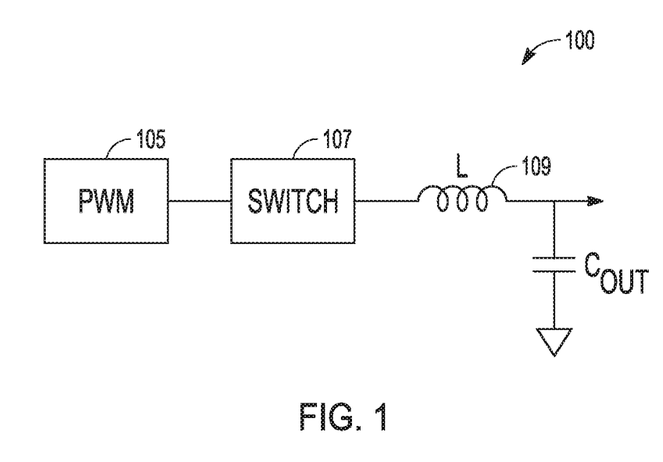
FIG. 1 is a block diagram of a fully integrated voltage regulator circuit in accordance with some embodiments.

FIG. 1 is a block diagram of an FIVR circuit 100. A FIVR often includes a pulse-width modulation (PWM) block 105 that provides a control loop to regulate the value of an output voltage provided by the voltage regulator. The PWM block controls switch circuit 107 to deliver electrical energy onto an inductor 109 from the power source.

Inductive circuit elements can adversely impact the size requirements of an electronic assembly. One approach is to fabricate air core inductors (ACIs) during the manufacturing of the electronic package and incorporate the ACIs into the electronic circuit using metal routing layers of the electronic packaging. Although referred to as "air core," ACIs can include an insulating dielectric material in the ACI core. These inductors are still referred to as ACIs because the insulating dielectric material has the same, or nearly the same, relative magnetic permeability as air (equal to 1.0).

Figure 2:
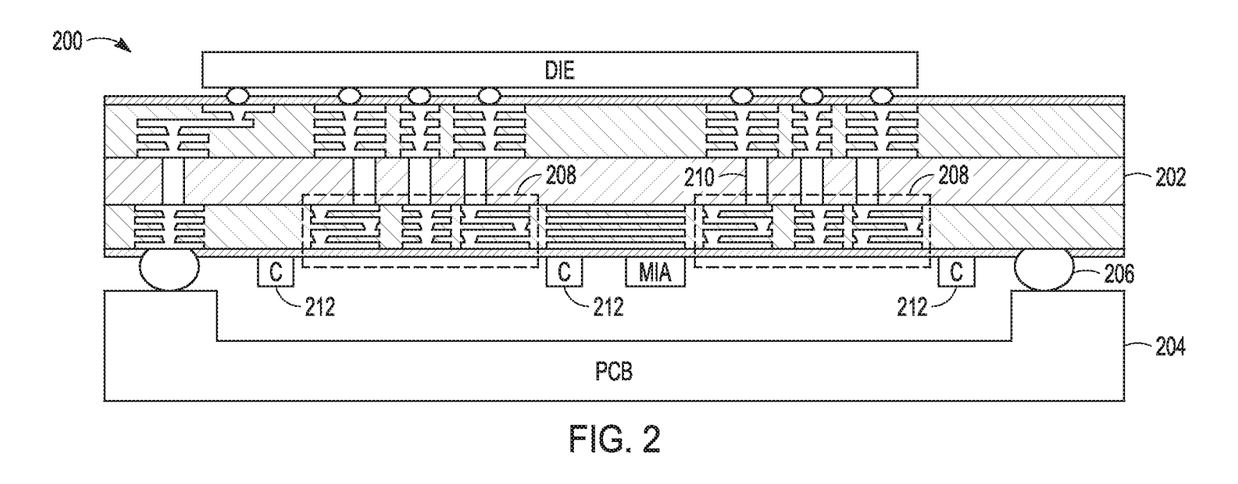
FIG. 2 is an illustration of a side view or cross section view of an integrated circuit (IC) device in accordance with some embodiments.

FIG. 2 is an illustration of a side view or cross section view of an IC device 200. The IC device includes an electronic semiconductor package 202 coupled to a printed circuit board 204 (e.g., a motherboard) by solder bumps or solder balls 206. The IC device includes two ACIs 208. The ACIs can be connected to other components of the electronic semiconductor package 202 by vias 210. The ACIs in the example of FIG. 2 include four turns. The number of turns that can be formed can be limited by the limit imposed by the fabrication process on the thickness of the substrate. The IC device also includes passive components 212 (e.g., capacitors and discrete inductors) on the land side of the IC package.

A challenge with using ACIs is that the FIVR efficiency is impacted by the size of the ACI coil, with larger coils desired for higher inductance L and lower resistance R. This can increase the number of substrate layers needed to form a large number of turns to increase L or to form parallel turn routing to reduce R. The increased number of layers can increase height and cost of the IC design. Also, for multi-FIVR designs, the ACI spacing requirement can limit the size of the ACIs, which can limit the increase in L and reduction in R available in the electronic assembly.

To increase the FIVR efficiency, one or more electrically conductive layers can be added external to the IC package and electrically connected to the ACI internal to the IC package. The one or more conductive layers may be electrically connected as one or more additional turns to increase inductance of the ACI, or connected to reduce resistance of the ACI.

Figure 3:
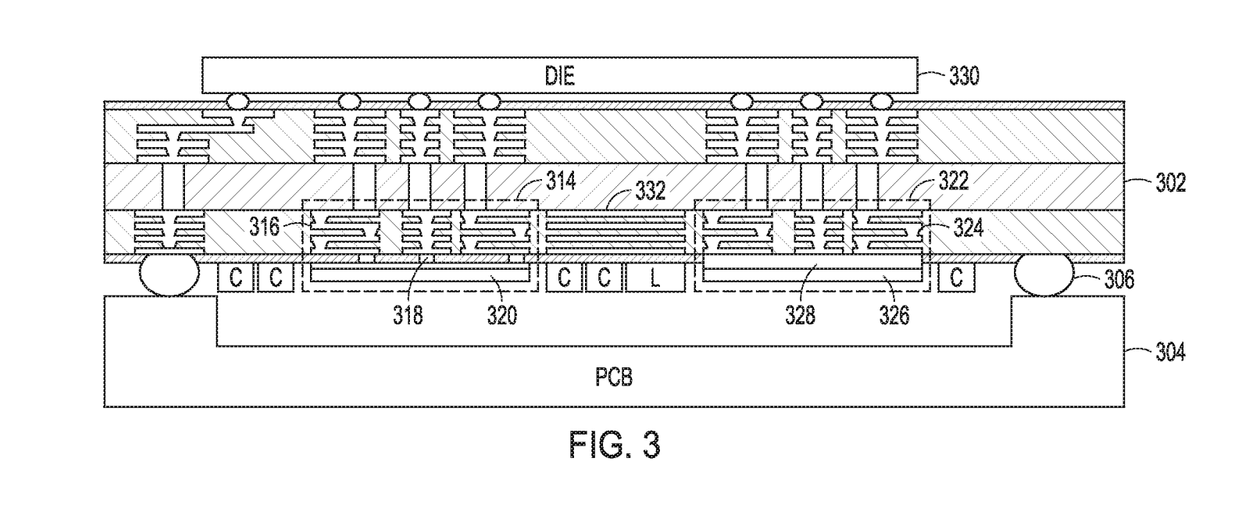
FIG. 3 is an illustration of a side view of another IC device in accordance with some embodiments.

FIG. 3 is an illustration of a side view of another IC device 300. The IC device includes an electronic semiconductor package 302 coupled to a printed circuit board 304 or PCB. The IC device 300 includes multiple ACIs including a first ACI 314. A first portion 316 of the ACI 314 is internal to the electronic semiconductor package 302, and a second portion of the ACI is external to the electronic semiconductor package 302. The external portion 320 is an electrically conductive layer arranged on the external surface of the electronic semiconductor package. The external portion 320 is electrically connected to the internal portion as an additional turn of the ACI. The electronic semiconductor package 302 includes pads (e.g., input-output pads or I/O pads) to connect the internal ACI portion and the external turn. A solder resist process can be used to create the openings 318 in the electronic semiconductor package 302 for the pads. The external portion 320 and passive components such as capacitors and discrete packaged inductors can be mounted to the landside surface of the IC package.

In some aspects, the external portion of the ACI can include more than one turn. For example, the external portion 320 can include multiple conductive layers alternating with insulating layers. The conducting layers can be connected as multiple turns. The example of FIG. 3 also shows a recess in motherboard (RIMB). This area between the electronic semiconductor package 302 and the PCB defines a space often under-utilized in IC device assemblies. The external portion 320 and the passive components can be arranged in the RIMB. The number of turns that can be included in the external portion may depend on the land side space (e.g., RIMB) available.

In some aspects, the external portion 320 can be a metal preform, or preformed element. The metal can include one or more of copper, aluminum, tungsten, etc. The process of preforming the metal can result in physically detectable features, such as evidence of work hardening from the preforming for example. The preformed element can be produced from a sheet or ribbon of metal using a stamping process. The stamping process may also result in physically detectable features, such as burrs on edges of the preformed element for example. The external portion 320 can be arranged on the external surface of the electronic semiconductor package 302 using an adhesive. In certain embodiments that external portion can be bonded with solder to the internal portion.

Figure 4:
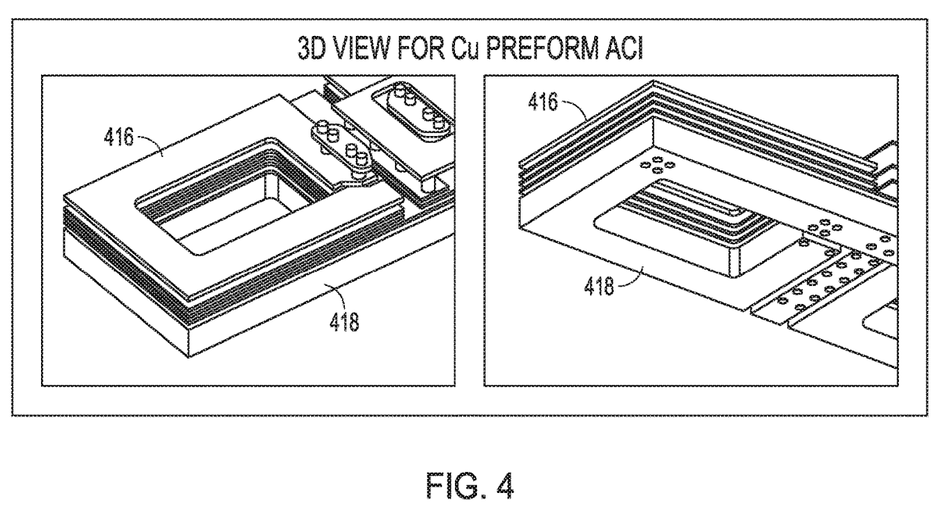
FIG. 4 is an illustration of a metal preform attached to an air core inductor in accordance with some embodiments.

FIG. 4 is an illustration of a metal preform 418 attached to a four turn ACI. The external package surface is not shown in the Figure and would be between the internal ACI 416 and the metal preform 418.

Returning to FIG. 3, the IC device 300 in the example includes a second ACI 322. Like the first ACI 314, a first portion 324 of the second ACI 322 is internal to the electronic semiconductor package 302, and a second portion of the ACI is external to the electronic semiconductor package 302. The external portion 326 is an electrically conductive layer arranged on the external surface of the electronic semiconductor package. The external portion 326 is an electrically, conductive layer electrically connected to reduce electrical resistance of at least one turn of the ACI. In the example shown in FIG. 3, an opening 328 in the IC package is formed (e.g., by a solder resist process) to expose a turn of the internal portion 322 of the ACI. The external portion 326 is bonded in parallel to the exposed turn (e.g., using solder paste) or a portion of the turn. The parallel bonding increases the effective thickness of the exposed turn of the ACI to reduce the electrical resistance of the exposed turn. The bonding either in series or parallel can result in detectable features such as a seam or solder joint where the preform is attached.

The example of FIG. 3 shows the external portion 326 on the land side of the electronic semiconductor package 302. If the ACI 322 extends to the land side surface and the opposite top surface, a second conductive layer can be bonded to a turn at the top surface to reduce a resistance of a turn at the top surface. The external portion 326 can be a metal preform.

The IC device 300 includes an IC die 330 arranged on the external surface opposite the landside surface. The IC die can include a FIVR circuit, and an ACI of the electronic semiconductor package 302 can be electrically connected to the FIVR circuit. The IC die 330 can include one or more processor circuits and one or more memory circuits. In some aspects, the IC die 330 includes multiple FIVR circuits that provide multiple voltage domains for the IC die 330. An ACI of electronic semiconductor package 302 can be electrically connected to each of the FIVR circuits of the IC die 330. The external portions of the ACIs can be used to reduce the overall size of the ACIs. This can result in a smaller electronic semiconductor package 302 for the same number of ACIs. Reducing the size of the ACIs can also allow for a larger power plane 332 internal to the electronic semiconductor package 302.

Figure 5A:
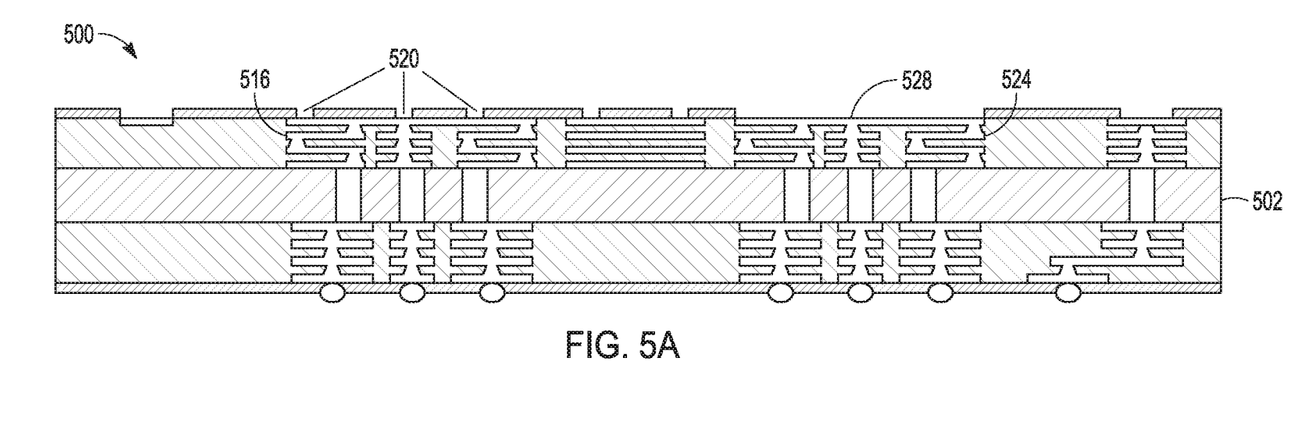
FIGS. 5A-5D is a flow diagram of a method of forming an electronic device in accordance with some embodiments.

FIGS. 5A-5D is a flow diagram of a method 500 of forming an electronic device, such as the IC device of the FIG. 3. The process flow begins by fabricating an ACI within an electronic semiconductor package. FIG. 5A is an illustration of a cross section view an electronic semiconductor package 502. The electronic semiconductor package 502 in FIG. 5A is inverted from the view in FIG. 3. The electronic semiconductor package 502 includes internal ACIs 516 and 524. At least one opening is formed on an outer surface of the electronic semiconductor package. In FIG. 5A, openings 520 are formed to contact ACI 516 and opening 528 is formed to contact ACI 524. Openings 520 will be used to connect an electrically conductive preform as an additional turn to ACI 516, and opening 528 will be used to connect an electrically conductive preform to reduce resistance of ACI 524. Although the flow diagram describes connecting conductive preforms to both increase inductance and reduce resistance, only one type of conductive preform may be connected and multiple preforms of the same type may be added to the electronic semiconductor package 502.

Figure 5B:
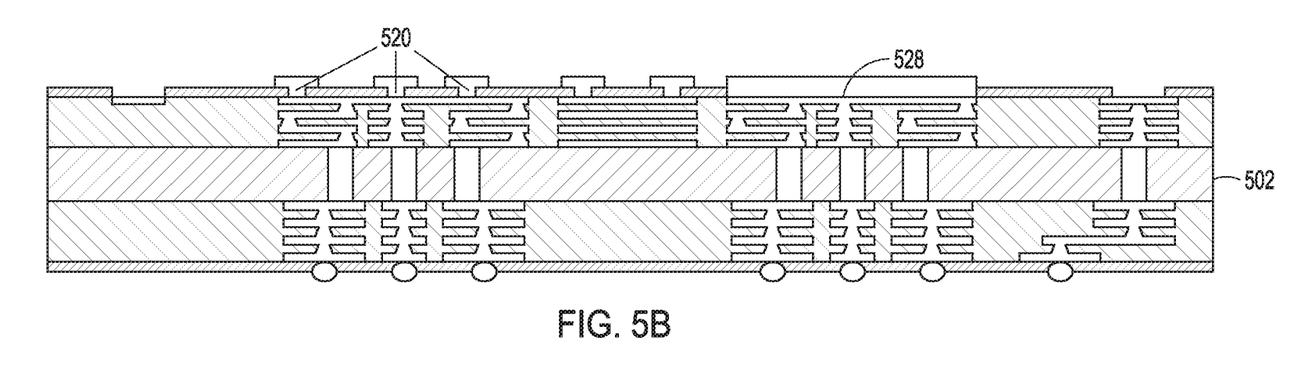

The openings 520 and 528 can be formed using a solder resist exposure and development process. In FIG. 5B, solder paste is printed at the locations of the openings 520 and 528.

Figure 5C:
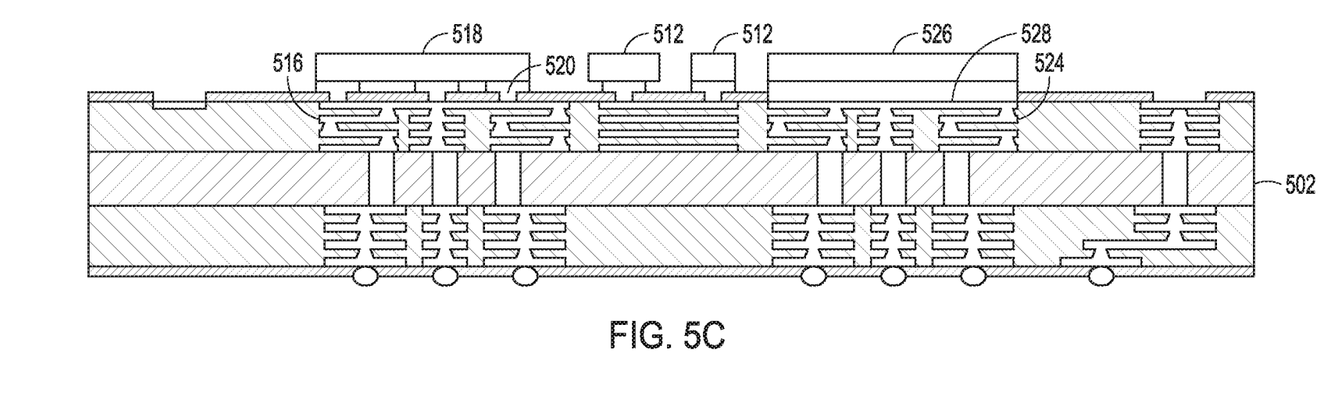

In FIG. 5C, electrically conductive preform 518 and electrically conductive preform 526 are arranged on the outer surface of the electronic semiconductor package 502. The electrically conductive preforms are electrically connecting the electrically conductive preform to the air core inductor using the openings 520 and 528 formed in the electronic semiconductor package. Electrically, conductive preform 518 is connected to ACI 516 as an added turn to the ACI coil to increase inductance of the internal ACI 516. Electrically conductive preform 526 is connected to internal ACI 524 to increase an effective thickness and lower the resistance of at least one turn of internal ACI 524. Passive electronic components 512 are also attached to the outer surface of the electronic semiconductor package 502. In FIG. 5C, the electrically conductive preforms and passive electronic components are attached to the land side outer surface of the electronic semiconductor package. The preforms can be coated with a passivation material such as nickel or tin for example.

Figure 5D:
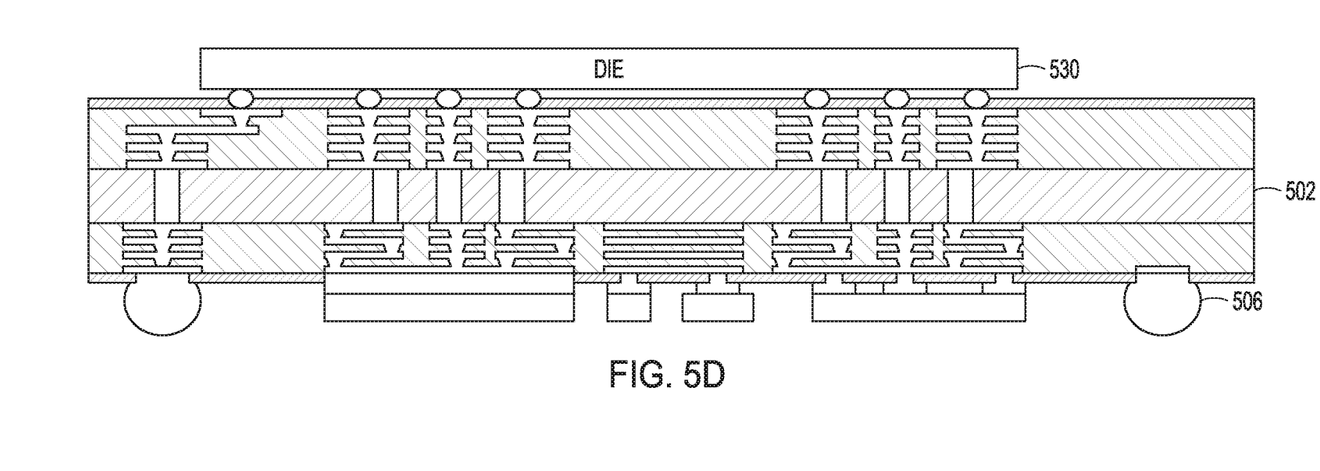

In FIG. 5D, the electronic semiconductor package 502 is inverted from the view in FIG. 5A. An IC die 530 is attached to the outer surface of the electronic semiconductor package that is opposite the surface (e.g., the land side surface) where the electrically conductive preforms were attached. Solder balls 506 or bumps may also be attached to the outer surface. The electronic semiconductor package 502 can be attached to a PCB using the solder balls as in the example of FIG. 3.

Figure 6A:
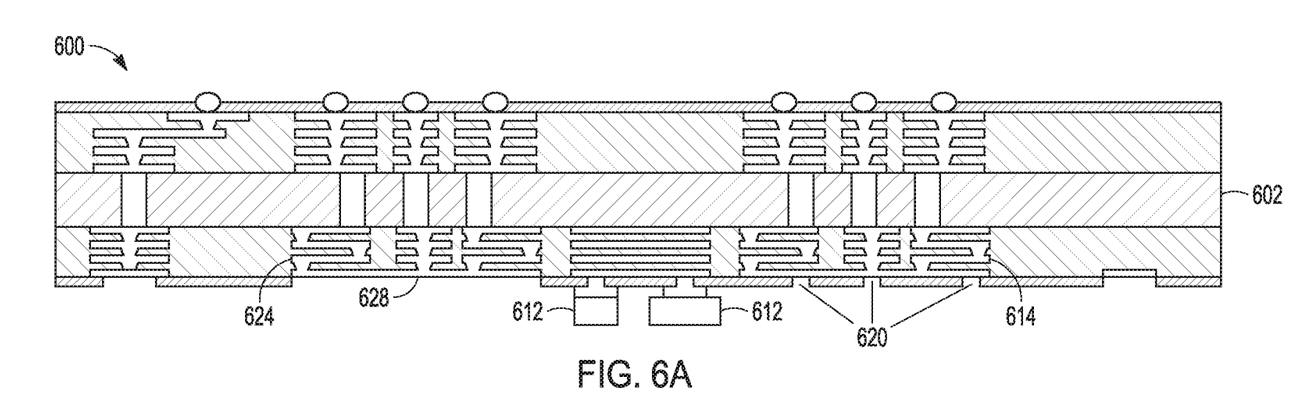
FIGS. 6A-6D is a flow diagram of another method of forming an electronic device in accordance with some embodiments.

FIGS. 6A-6D is a flow diagram of another method 600 of forming an electronic device. FIG. 6A is an illustration of a cross section view an electronic semiconductor package 602. The electronic semiconductor package 602 includes openings 620 and 628 for connecting electrically conductive preforms to ACI. The electronic semiconductor package 602 may be produced by a supplier and may include passive electronic components 612 already surface mounted to the electronic semiconductor package 602.

Figure 6B:
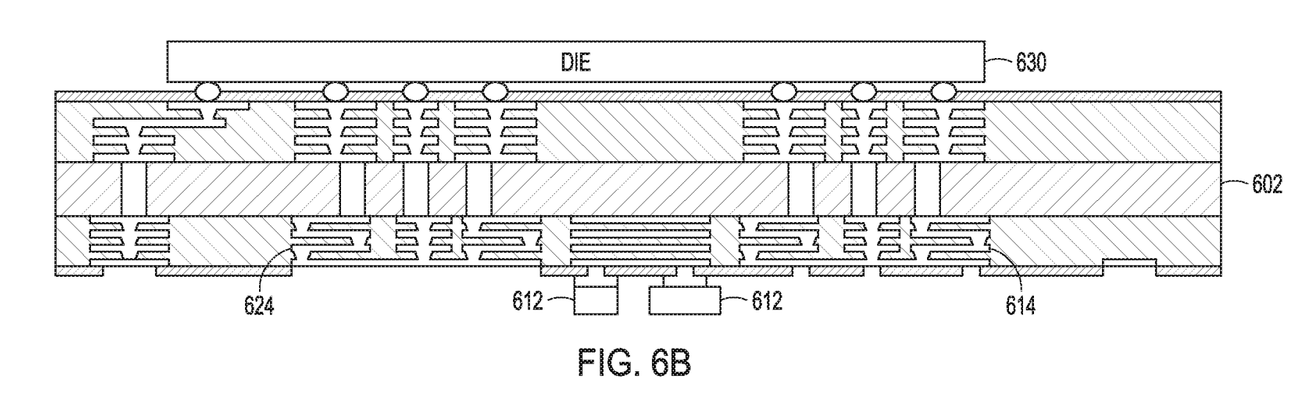

In FIG. 6B, an IC die 630 is attached to the outer surface of the electronic semiconductor package that is opposite to the surface having the openings 620 and 628 for attachment to the electrically conductive preforms. One difference from the flow diagram of FIGS. 5A-5D is that the IC die is attached prior to the attachment of an electrically conductive preform.

Figure 6C:
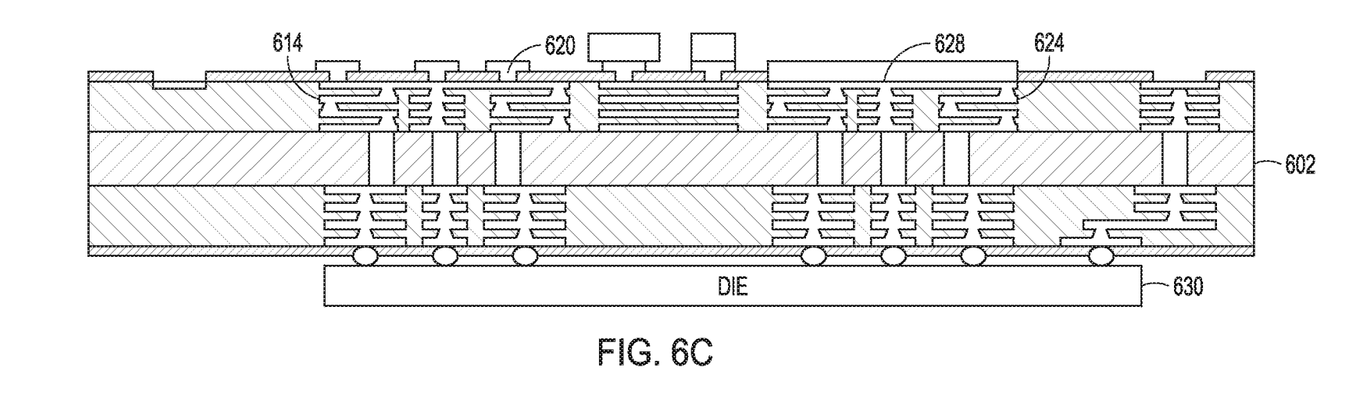

In FIG. 6C, the electronic semiconductor package 602 is inverted from the view in FIG. 6A and flipped left to right. Solder paste is printed at the locations of the openings 620 and 628.

Figure 6D:
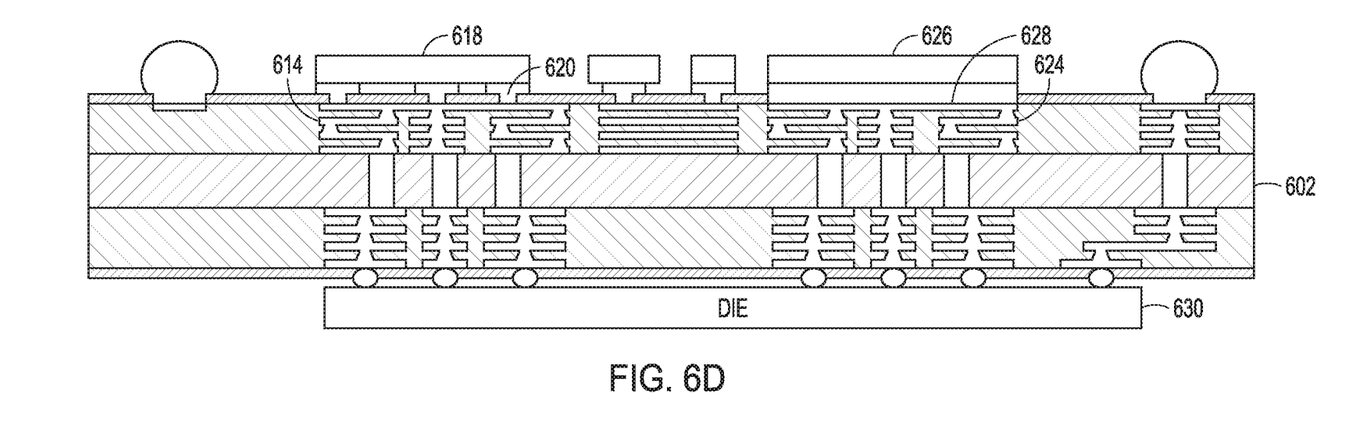

In FIG. 6D, electrically conductive preform 618 and electrically conductive preform 626 are arranged on the outer surface (e.g., the land side surface) of the electronic semiconductor package 602. Electrically conductive preform 618 is connected to internal ACI 616 as an added turn to the ACI coil to increase inductance of the internal ACI 616. Electrically conductive preform 626 is connected to internal ACI 624 to increase an effective thickness and lower the resistance of at least one turn of internal ACI 624. Solder balls 606 or bumps are attached to the land side outer surface.

An example of an electronic device using assemblies with system level packaging as described in the present disclosure is included to show an example of a higher level device application.

Figure 7:
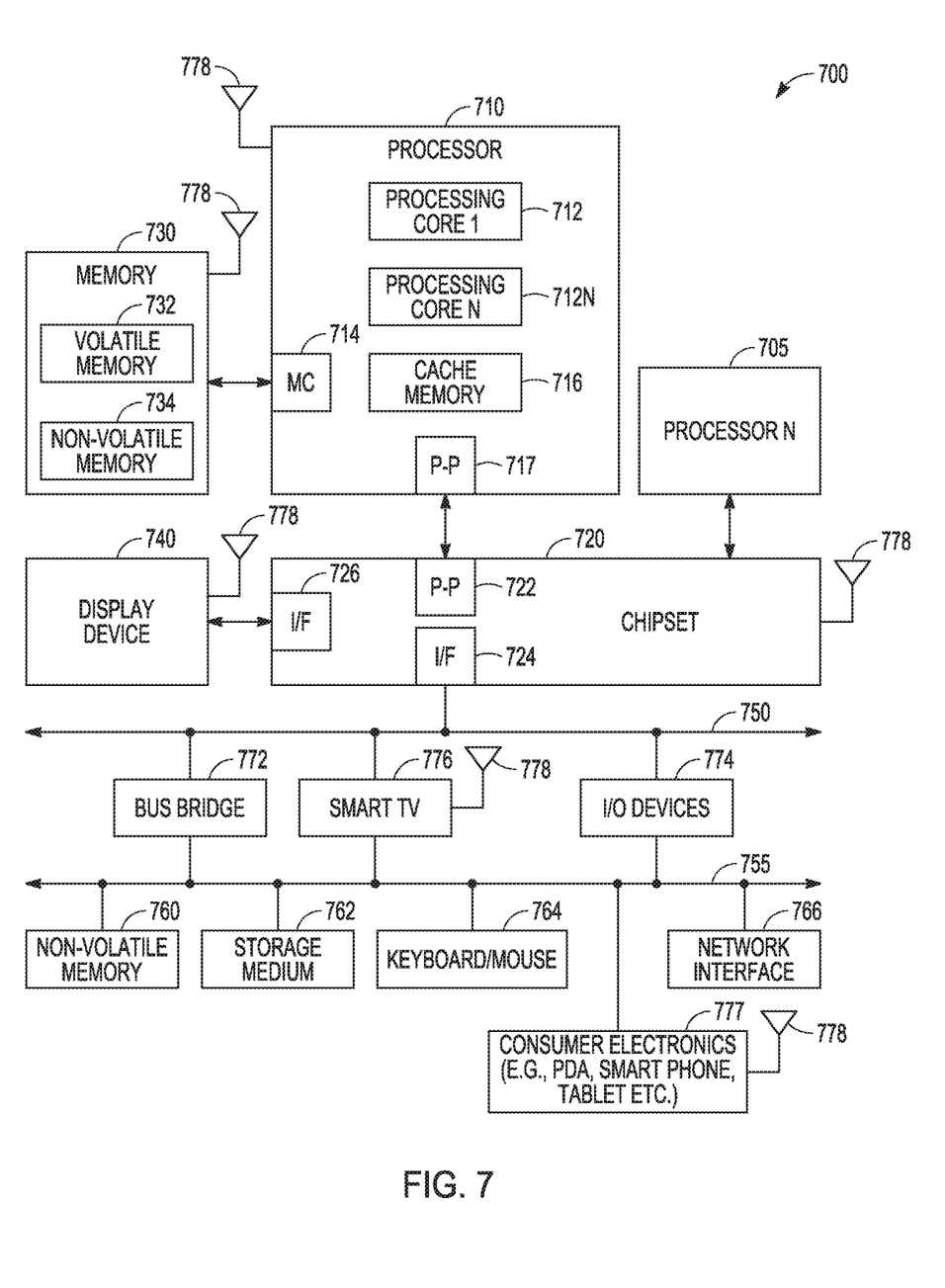
FIG. 7 is a system level diagram in accordance with some embodiments.

FIG. 7 is a system level diagram, according to one embodiment of the invention. For instance, FIG. 7 depicts an example of an electronic device (e.g., system) that can include one or more of the air core inductors as described in the present disclosure. In one embodiment, system 700 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 700 is a system on a chip (SOC) system. In one example, two or more systems as shown in FIG. 7 may be coupled together using one or more SWC cables as described in the present disclosure. In one specific example, one or more SWC interconnections as described in the present disclosure may implement a serial bus.

In one embodiment, processor 710 has one or more processing cores 712 and 712N, where N is a positive integer and 712N represents the Nth processor core inside processor 710. In one embodiment, system 700 includes multiple processors including 710 and 705, where processor 705 has logic similar or identical to the logic of processor 710. In some embodiments, processing core 712 includes, but is not limited to, pre-fetch logic to fetch instructions, decode logic to decode the instructions, execution logic to execute instructions and the like. In some embodiments, processor 710 has a cache memory 716 to cache instructions and/or data for system 700. Cache memory 716 may be organized into a hierarchal structure including one or more levels of cache memory.

In some embodiments, processor 710 includes a memory controller 714, which is operable to perform functions that enable the processor 710 to access and communicate with memory 730 that includes a volatile memory 732 and/or a non-volatile memory 734. In some embodiments, processor 710 is coupled with memory 730 and chipset 720. Processor 710 may also be coupled to a wireless antenna 778 to communicate with any device configured to transmit and/or receive wireless signals. In one embodiment, the wireless antenna interface 778 operates in accordance with, but is not limited to, the IEEE 802.11 standard and its related family, Home Plug AV (HPAV), Ultra-Wide Band (UWB), Bluetooth, WiMax, or any form of wireless communication protocol.

In some embodiments, volatile memory 732 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 734 includes, but is not limited to, flash memory, phase change memory (PCM), read-only memory (ROM), electrically erasable programmable read-only memory (EEPROM), or any other type of non-volatile memory device.

Memory 730 stores information and instructions to be executed by processor 710. In one embodiment, memory 730 may also store temporary variables or other intermediate information while processor 710 is executing instructions. In the illustrated embodiment, chipset 720 connects with processor 710 via Point-to-Point (PtP or P-P) interfaces 717 and 722. Chipset 720 enables processor 710 to connect to other elements in system 700. In some embodiments of the invention, interfaces 717 and 722 operate in accordance with a PtP communication protocol such as the Intel® QuickPath Interconnect (QPI) or the like. In other embodiments, a different interconnect may be used.

In some embodiments, chipset 720 is operable to communicate with processor 710, 705N, display device 740, and other devices 772, 776, 774, 760, 762, 764, 766, 777, etc. Buses 750 and 755 may be interconnected together via a bus bridge 772. Chipset 720 connects to one or more buses 750 and 755 that interconnect various elements 774, 760, 762, 764, and 766. Chipset 720 may also be coupled to a wireless antenna 778 to communicate with any device configured to transmit and/or receive wireless signals. Chipset 720 connects to display device 740 via interface (I/F) 726. Display 740 may be, for example, a liquid crystal display (LCD), a plasma display, cathode ray tube (CRT) display, or any other form of visual display device. In some embodiments of the invention, processor 710 and chipset 720 are merged into a single SOC. In one embodiment, chipset 720 couples with a non-volatile memory 760, a mass storage medium 762, a keyboard/mouse 764, and a network interface 766 via I/F 724 and/or I/F 726, I/O devices 774, smart TV 776, consumer electronics 777 (e.g., PDA, Smart Phone, Tablet, etc.).

In one embodiment, mass storage medium 762 includes, but is not limited to, a solid state drive, a hard disk drive, a universal serial bus flash memory drive, or any other form of computer data storage medium. In one embodiment, network interface 766 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra-Wide Band (UWB), Bluetooth, WiMax, or any form of wireless communication protocol.

While the modules shown in FIG. 7 are depicted as separate blocks within the system 700, the functions performed by some of these blocks may be integrated within a single semiconductor circuit or may be implemented using two or more separate integrated circuits. For example, although cache memory 716 is depicted as a separate block within processor 710, cache memory 716 (or selected aspects of 716) can be incorporated into processor core 712.

The devices, systems, and methods described can provide an external means to increase the inductance and decrease the resistance of an ACI internal to an electronic package. If the ACI is included in an FIVR circuit, the improvement to the ACI can improve the efficiency of the FIVR circuit.

Additional Description and Examples

Example 1 includes subject matter (such as an electronic device) comprising an air core inductor. The air core inductor includes an electronic semiconductor package including a first portion of the air core inductor internal to the electronic semiconductor package; and an electrically conductive layer arranged on a first external surface of the electronic semiconductor package and electrically connected as a second portion of the air core inductor.

In Example 2, the subject matter of Example 1, optionally includes the electrically conductive layer electrically connected as at least one turn of the air core inductor.

In Example 3, the subject matter of one or both of Examples 1 and 2 optionally includes the electrically conductive layer connected to increase a thickness of at least one turn of the air core inductor.

In Example 4, the subject matter of one or any combination of Examples 1-3 optionally includes an integrated circuit (IC) die arranged on a second external surface opposite the first external surface, wherein the IC die includes a fully integrated voltage regulator (FIVR) circuit and the air core inductor is electrically connected to the FIVR circuit.

In Example 5, the subject matter of one or any combination of Examples 1-4 optionally includes an IC die including a processor circuit.

In Example 6, the subject matter of one or any combination of Examples 1-5 optionally includes the electrically conductive layer including a metal preform and the first external surface of the electronic semiconductor package is a land side surface of the electronic semiconductor package, and the electronic device includes the metal preform and a plurality of passive electronic components arranged on the land side surface.

In Example 7, the subject matter of Example 6 optionally includes the land side surface of the electronic semiconductor package coupled to a substrate using solder bumps, wherein the substrate includes a recess in motherboard (RIMB) and the electrically conductive layer and the passive electronic components are arranged in the RIMB.

In Example 8, the subject matter of Example 6 optionally includes metal preform including copper, and the plurality of passive electronic components including capacitors and discrete inductors.

Example 9 includes subject matter (such as a method of forming an electronic device), or can optionally be combined with one or any combination of Examples 1-8 to include such subject matter, comprising fabricating an air core inductor within an electronic semiconductor package; forming at least one opening on a first outer surface of the electronic semiconductor package; arranging a preformed electrically conductive element on the first outer surface of the electronic semiconductor package; and electrically connecting the preformed electrically conductive element to the air core inductor using the at least one opening in the electronic semiconductor package.

In Example 10, the subject matter of Example 9 optionally includes electrically connecting the preformed electrically conductive element to the air core inductor as at least one turn of the air core inductor via the at least one opening in the electronic semiconductor package.

In Example 11, the subject matter of one or both of Examples 9 and 10 optionally includes electrically connecting the preformed electrically conductive element, via the at least one opening in the electronic semiconductor package, to increase an effective thickness of at least one turn of the air core inductor.

In Example 12, the subject matter of one or any combination of Examples 9-11 optionally includes arranging the preformed electrically conductive element includes attaching the electrically conductive preform on a land side outer surface of the electronic semiconductor package, and attaching a plurality of passive electronic components on the land side surface.

In Example 13, the subject matter of one or any combination of Examples 9-12 optionally includes attaching an integrated circuit (IC) die to a second outer surface of the electronic semiconductor package opposite the first outer surface.

In Example 14, the subject matter of Example 13 optionally includes attaching the IC die prior to the arranging of the preformed electrically conductive element on the first outer surface of the electronic semiconductor package.

In Example 15, the subject matter of one or any combination of Examples 9-14 optionally includes forming at least one opening includes forming the at least one opening using solder resist exposure and development to form a solder resist opening in the first outer surface of the electronic semiconductor package.

In Example 16, the subject matter of one or any combination of Examples 9-15 optionally includes attaching the first outer surface of the electronic semiconductor package to a printed circuit board (PCB).

Example 17 includes subject matter (such as an electronic device), or can optionally be combined with one or any combination of Examples 1-16 to include such subject matter, comprising a plurality of air core inductors. The air core inductors include an electronic semiconductor package including a first portion of each of the air core inductors internal to the electronic semiconductor package, and a plurality of electrically conductive layers arranged on a first external surface of the electronic semiconductor package and each of the plurality of electrically conductive layers electrically connected as a second portion of each of the air core inductors.

In Example 18, the subject matter of Example 17 optionally includes an integrated circuit (IC) die arranged on a second external surface opposite the first external surface, wherein the IC die includes a plurality of fully integrated voltage regulator (FIVR) circuits configured to produce a plurality of voltage domains for the IC die, and each of the air core inductors is electrically connected to a FIVR circuit of the plurality of FIVR circuits.

In Example 19, the subject matter of one or both of Examples 17 and 18 optionally includes at least a portion of the plurality of electrically conductive layers are electrically connected as at least one turn of a corresponding air core inductor.

In Example 20, the subject matter of one or any combination of Examples 17-19 optionally includes at least a portion of the plurality of electrically conductive layers are electrically connected to reduce electrical resistance of at least one turn of a corresponding air core inductor.

These non-limiting examples can be combined in any permutation or combination. The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An electronic device comprising:
an air core inductor including:
an electronic semiconductor package including a first portion of the air core inductor internal to the electronic semiconductor package and including at, least, one complete internal turn of the air core inductor; and
an external electrically conductive layer that is a metal preform arranged on a first external surface of the electronic semiconductor package and electrically connected to the at least one complete internal turn as a second portion of the air core inductor.

2. The electronic device of claim 1, wherein the external electrically conductive layer includes at least one complete external turn of the air core inductor that is electrically connected to the at least one complete internal turn of the air core inductor.

3. The electronic device of claim 1, wherein the external electrically conductive layer is connected to increase a thickness of the at least one complete internal turn of the air core inductor.

4. The electronic device of claim 1, including air integrated circuit (IC) die arranged on a second external surface opposite the first external surface, wherein the IC die includes a fully integrated voltage regulator (FIVR) circuit and the air core inductor is electrically connected to the FIVR circuit.

5. The electronic device of claim 4, wherein the IC die includes a processor circuit.

6. The electronic device of claim 1, wherein the first external surface of the electronic semiconductor package is a land side surface of the electronic semiconductor package, and the electronic device includes the metal preform and a plurality of passive electronic components arranged on the land side surface.

7. The electronic device of claim 6, wherein the land side surface of the electronic semiconductor package is coupled to a substrate using solder bumps, wherein the substrate includes a recess in motherboard (RIMB) and the electrically conductive layer and the passive electronic components are arranged in the RIME.

8. The electronic device of claim 6, wherein the metal preform includes copper and the plurality of passive electronic components includes capacitors and discrete inductors.

9. A method of forming an electronic device, the method comprising:
fabricating an air core inductor within an electronic semiconductor package;
forming at least one opening on a first outer surface of the electronic semiconductor package that is a land side outer surface;
attaching a preformed external electrically conductive element on the first outer surface of the electronic semiconductor package;
attaching a plurality of passive electronic components on the land side surface; and
electrically connecting the electrically conductive preformed element to the air core inductor using the at least one opening in the electronic semiconductor package.

10. The method of claim 9, including electrically connecting the preformed electrically conductive element to the air core inductor as at least one turn of the air core inductor via the at, least, one opening in the electronic semiconductor package.

11. The method of claim 9, including electrically connecting the preformed electrically conductive element, via the at least one opening in the electronic semiconductor package, to increase an effective thickness of at least one turn of the air core inductor.

12. The method of claim 9, including attaching an integrated circuit (IC) die to a second outer surface of the electronic semiconductor package opposite the first outer surface.

13. The method of claim 12, wherein the IC die is attached prior to the arranging of the preformed electrically conductive element on the first outer surface of the electronic semiconductor package.

14. The method of claim 9, wherein forming at least one opening includes forming the at least one opening using solder resist exposure and development to form a solder resist opening in the first outer surface of the electronic semiconductor package.

15. The method of claim 9, including attaching the first outer surface of the electronic semiconductor package to a printed circuit board (PCB).

16. An electronic device comprising:
a plurality of air core inductors including:
an electronic semiconductor package including a first portion of each of the air core inductors internal to the electronic semiconductor package and including at least one complete internal turn of each of the air core inductors; and
a plurality of external electrically conductive layers arranged on a first external surface of the electronic semiconductor package and wherein each of the plurality of external electrically conductive layers is an external metal preform electrically connected to the at least one complete internal turn of each of the air core inductors as a second portion of the air core inductors.

17. The electronic device of claim 16, including an integrated circuit (IC) die arranged on a second external surface opposite the first external surface, wherein the IC die includes a plurality of fully integrated voltage regulator (FIVR) circuits configured to produce a plurality of voltage domains for the IC die, and each of the air core inductors is electrically connected to a FIVR circuit of the plurality of FIVR circuits.

18. The electronic device of claim 16, wherein the plurality of external electrically conductive layers each include at least one complete external turn of a corresponding air core inductor that is electrically connected to the at least one complete internal turn of the corresponding air core inductor.

19. The electronic device of claim 16, wherein the plurality of external electrically conductive layers are each electrically connected to reduce electrical resistance of at the least one complete internal turn of a corresponding air core inductor.

* * * * *

UNITED STATES PATENT AND TRADEMARK OFFICE
CERTIFICATE OF CORRECTION

| | |
|---|---|
| PATENT NO. | : 11,264,160 B2 |
| APPLICATION NO. | : 16/402467 |
| DATED | : March 1, 2022 |
| INVENTOR(S) | : Goh et al. |

It is certified that error appears in the above-identified patent and that said Letters Patent is hereby corrected as shown below:

In the Claims

In Column 9, Line 15, in Claim 1, delete "at, least," and insert --at least-- therefor In Column 9, Line 31, in Claim 4, delete "air" and insert --an-- therefor In Column 9, Line 50, in Claim 7, delete "RIME." and insert --RIMB.-- therefor In Column 10, Line 8, in Claim 10, delete "at, least," and insert --at least-- therefor In Column 10, Lines 62-63, in Claim 19, delete "at the" and insert --the at-- therefor Signed and Sealed this
Fourth Day of July, 2023

Katherine Kelly Vidal
*Director of the United States Patent and Trademark Office*